United States Patent [19]
Bracher

[11] 4,182,265
[45] Jan. 8, 1980

[54] WAFER SUPPORT

[75] Inventor: Bernhard Bracher, Balzers, Liechtenstein

[73] Assignee: Balzers Aktiengesellschaft für Hochvakuumtechnik und Dünne Schichten, Liechtenstein

[21] Appl. No.: 886,353

[22] Filed: Mar. 14, 1978

[30] Foreign Application Priority Data

Mar. 14, 1977 [DE] Fed. Rep. of Germany ....... 7707767

[51] Int. Cl.² ............................................ B05C 13/02
[52] U.S. Cl. ..................................... 118/500; 118/730; 156/612; 248/311.1 R
[58] Field of Search .................... 118/500, 503, 48, 49; 427/166, 167; 269/254 R, 257, 287, 134, 135, 136, 137, 138, 139, 291, 315, 317; 248/311.1 R, 311.3, 313, 316 R; 156/612, 610, 603

[56] References Cited

U.S. PATENT DOCUMENTS

| 3,675,624 | 7/1972 | Hunts et al. | 118/503 |
| 3,699,917 | 10/1972 | Deverse et al. | 118/503 |
| 3,918,756 | 11/1975 | Saville et al. | 118/500 |
| 4,068,814 | 1/1978 | Anthony et al. | 118/503 |
| 4,096,023 | 6/1978 | Bivens | 269/134 |
| 4,113,547 | 9/1978 | Katz | 118/500 |

*Primary Examiner*—Ralph S. Kendall
*Attorney, Agent, or Firm*—McGlew and Tuttle

[57] ABSTRACT

A wafer support, comprising, a baseplate with an aperture therein and a holding ring rotatably positioned in the aperture. A platform is defined in the holding ring for supporting the peripheral edges of a wafer disposed therein and the holding ring includes a plurality of spaced slots extending parallel to the platform and spaced therefrom. A plurality of retaining rods are connected to the baseplate and extend into the slots to engage over the wafer positioned on the platform. A portion of the holding ring adjacent each slot defines a retaining rod abutment for urging each retaining rod out of its respective slot when the holding rod is rotated in the baseplate to release the supported wafer.

8 Claims, 4 Drawing Figures

WAFER SUPPORT

FIELD AND BACKGROUND OF THE INVENTION

The present invention relates in general to supports for wafers and, in particular, to a new and useful support for a wafer preferably for treatment in a vacuum vaporization apparatus, which comprises a rotatable holding ring that includes a platform for supporting the wafer and a plurality of slots extending parallel to the wafer with retaining rods extending into the slots and engaged over the supported wafer.

DESCRIPTION OF THE PRIOR ART

Various requirements are imposed on a support for wafers of a vacuum vaporization apparatus. They must be reliable in service and comprise only a small number of individual component parts. That is, because of the unavoidable contamination occuring during operation, the supports must be cleaned regularly and the work connected thereto is greater, the more component parts are involved. Such work includes disassembling, reassembling and cleaning of the individual parts.

The supports must also be of a design which makes it possible to insert the wafers prior to the treatment and to remove them again after the treatment not only manually, but also by means of automatic charging devices. A manual charging is not only slower, but has the disadvantage that the wafers, if picked up, for example, on their edge by tweezers, may be easily damaged. With automatic charging devices, on the other hand, this can largely be avoided and the reject rate can be kept lower.

SUMMARY OF THE INVENTION

The present invention is directed to a supporting device for wafers which makes it possible to insert a wafer into, and remove it from the support with a minimum of manipulation steps, thus, offering a great retaining reliability even with wafers of larger size, and which is particularly suitable for use in connection with automatic charging and removing mechanisms.

The inventive support for wafers includes a baseplate and a holding ring which is rotatably supported in an aperture of the baseplate and which is provided with a platform in the form of a shoulder for supporting the wafer to be treated. The holding ring is provided with a plurality of slots extending parallel to the plane of the platform and each slot is associated with a retaining rod which is secured to the baseplate outside the circumference of the holding ring. Each rod extends through the slot and engages over the wafer to hold it in place. In a particular embodiment, four slots with associated retaining rods are provided at the circumference of the holding ring, with the retaining rods being formed by the end portions of V-shaped springs.

Accordingly, it is an object of the invention to provide a wafer support, comprising, a baseplate with an aperture therein, a holding ring rotatably positioned in the aperture, a platform in said holding ring defining a support for supporting a wafer thereon, said holding ring including at least one slot extending parallel to said platform and spaced therefrom, at least one retaining rod connected to said baseplate and extending into said slot for engagement over the wafer on said platform, a portion of said holding ring adjacent said slot defining a retaining rod abutment for urging said retaining rod out of said slot when said holding ring is rotated on said base.

A further object of the present invention is to provide a wafer support which is simple in design, rugged in construction and economical to manufacture.

The various features of novelty which characterize the invention are pointed out with particularity in the claims annexed to and forming a part of this disclosure. For a better understanding of the invention, its operating advantages and specific objects attained by its uses, reference is made to the accompanying drawing and descriptive matter in which a preferred embodiment of the invention is illustrated.

DESCRIPTION OF THE PREFERRED EMBODIMENT

Figure 1:
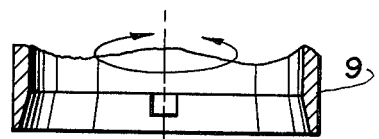
FIG. 1 is a cross-sectional, side elevational view of a wafer support constructed in accordance with the invention.

Referring now to the drawing in particular, the invention embodied therein in FIG. 1 comprises, a baseplate 1 with an aperture 2 having a holding ring 3 rotatably mounted therein. A wafer 5 is supported on a platform or shoulder 4 defined within the holding ring 3 and is held down by retaining rods 7 which extend through slots 6 (FIG. 4) and engage over wafer 5 (FIG. 2) to hold it on platform or shoulder 4.

Figure 2:
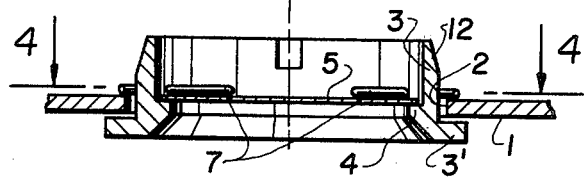
FIG. 2 is a top plan view of the wafer support shown in FIG. 1.
Figure 2:
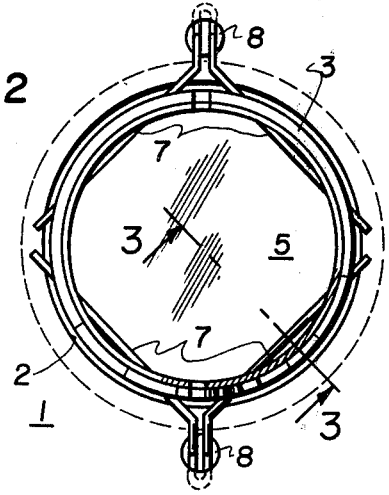
Figure 3:
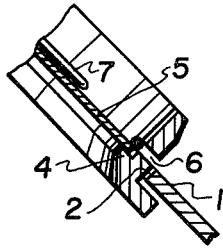
FIG. 3 is a sectional view taken along line 3—3 of FIG. 2.
Figure 4:
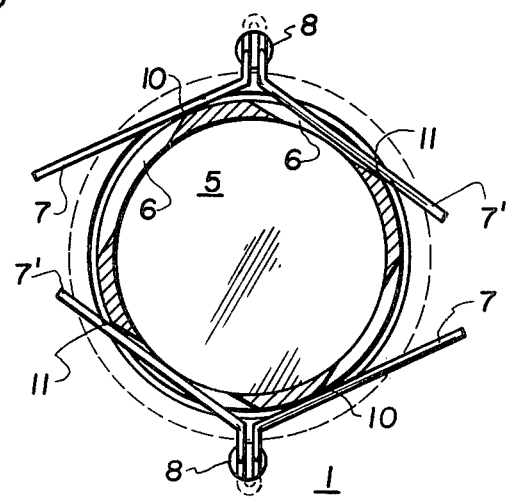
FIG. 4 is a sectional view taken along line 4—4 of FIG. 1.

In FIGS. 1, 2 and 3, the support with the inserted wafer 5 is shown in its closed or retaining position, while in FIG. 4, it is shown in its open or release position. The baseplate 1 is of a size and shape which is adapted to the clamping mechanism of the apparatus in which the wafer is to be treated. In vacuum vaporizers, for example, the baseplate may take the shape of a spherical cap which is positioned to face the vapor source. The baseplate is provided with one or more of the apertures 2 for receiving the rotatable holding rings 3. The holding rings, in turn, are provided with the circular shoulders 4 which serve as supporting surfaces for wafers 5. The ring shown in the present example is provided with four slots 6 which extend parallel to the plane of the ring and each of which is associated with a retaining rod 7. The retaining rods are secured to the baseplate at 8, outside the ring 3, and they extend, in the retaining position of the support, through slots 6 and through the interior of the ring while engaging over a cord of the wafers to be retained.

The retaining rods 7, however, can extend into the interior of ring 3 only when ring 3 is at a definite angular position. In this position, an inserted wafer is retained in its place by the rods engaging thereover, and the support is then closed. If the holding ring is then rotated through a definite angle and thereby brought out of its closing position, the retaining rods are pushed more or less outwardly by their abutment with ring portions or retaining rod abutments 10 and 11 in FIG. 4, until they no longer engage over the wafer. This unlocks the support and releases the wafer which can then be removed.

The device described is particularly adaptable for charging by means of automatic charging mechanisms, because in such instances, the closing and opening by rotation through a definite angle can be reliably ensured. In this case, it is also advantageous to design the holding ring 3 as a coupling member for receiving a rotary motion from the charging mechanism for closing or opening the device. In the most simple design, it is sufficient to provide a chamfered neck portion 12, as shown in FIG. 1. The neck 12 of the ring might also be provided, for this purpose, with a gear rim as the coupling element.

In FIG. 1, a dispenser tube 9 of a charging mechanism is indicated, which, after being engaged on the chamfered neck 12 of holding ring 3, transfers a wafer onto platform 4, whereupon, the initially open holding device is closed by a rotary motion through a predetermined angle. For discharging, the same operation is performed in reverse order.

In the embodiment shown, the retaining rods 7 serve the additional purpose of fixing the holding ring to the baseplate. To this end, a relative arrangement of the rods and the holding ring is provided which ensures that even in the disengaged or open position, at least two of the retaining rods are urged toward the outside only to such an extent that they no longer engage over the wafer but so that they still remain engaged in the slot with which they are associated. Then, by means of these two retaining rods, designated 7' in FIG. 4, the holding ring 3 which, on its bottom side is provided with a flange 3', is firmly clamped to the baseplate 1 even in the open position of the device.

The invention is of course not limited to a design for supporting circular wafers. The interior of ring 3 and shoulder 4 may be made conformable also to other shapes of wafers, for example, square wafers, but it must be ensured that the rods engage over the wafer through the slots in the closed position.

While a specific embodiment of the invention has been shown and described in detail to illustrate the application of the principles of the invention, it will be understood that the invention may be embodied otherwise without departing from such principles.

What is claimed is:

1. A wafer support, comprising, a baseplate with an aperture therein, a holding ring rotatably positioned in said aperture, a platform in said holding ring for supporting a wafer, said holding ring including at least one slot extending parallel to said platform and spaced therefrom, at least one retaining rod connected to said baseplate extending into said slot and engageable over the wafer on said support platform, and a portion of said holding ring adjacent said slot defining a retaining rod abutment for urging said retaining rod out of said slot and out of engagement with the wafer when said holding ring is rotated in said base.

2. A wafer support, as claimed in claim 1, wherein said holding ring further includes four slots spaced around said holding ring with a retaining rod engageable in each slot, said retaining rods being divided into pairs of rods secured together in the form of V-shaped springs.

3. A wafer support, as claimed in claim 1, wherein said holding ring further includes a coupling element which is engageable for the rotation of said holding ring.

4. A wafer support, as claimed in claim 1, wherein said baseplate includes a plurality of apertures each having a rotatably mounted holding ring therein.

5. A wafer support, as claimed in claim 4, wherein said baseplate is in the form of a spherical cap of a vapor deposition apparatus.

6. A wafer support, as claimed in claim 1, wherein said platform for supporting said wafer is in the form of a shoulder within said holding ring.

7. A wafer support, as claimed in claim 1, wherein said holding ring includes a flange portion extending radially outwardly of said aperture in said baseplate to retain said holding ring within said baseplate, and said retaining rod is not urged completely out of said slot by the rotation of said holding ring to retain said holding ring on said baseplate.

8. A wafer support, as claimed in claim 2, wherein said holding ring is rotated to a selected extent so that all of said retaining rods are disengaged from the wafer and at least some of said retaining rods remain at least partially within at least some of said slots.

* * * * *